(12) United States Patent
Dautenhahn (10) Patent No.: US 8,196,799 B2
(45) Date of Patent: Jun. 12, 2012

(54) COMPRESSION BOX FOR REFLOW OVEN HEATING WITH A PRESSURIZING PLATE

(75) Inventor: Jonathan M. Dautenhahn, Linn Creek, MO (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 13/167,272

(22) Filed: Jun. 23, 2011

(65) Prior Publication Data

US 2011/0315746 A1      Dec. 29, 2011

Related U.S. Application Data

(60) Provisional application No. 61/359,222, filed on Jun. 28, 2010.

(51) Int. Cl.
  *B23K 1/00* (2006.01)
  *B01J 3/04* (2006.01)
  *F27B 5/14* (2006.01)

(52) U.S. Cl. ............. 228/42; 228/43; 432/120; 432/202

(58) Field of Classification Search ............. 228/42, 228/43, 46, 219, 222, 47.1, 49.5, 233.2, 234.1; 432/36, 48, 120, 200, 201, 202, 233, 247, 432/249; 219/388, 391, 395, 400
See application file for complete search history.

(56) References Cited

U.S. PATENT DOCUMENTS

| | | | |
|---|---|---|---|
| 4,775,776 A | 10/1988 | Rahn et al. | |
| 5,069,380 A | 12/1991 | Deambrosio | |
| 5,193,735 A | 3/1993 | Knight | |
| 5,347,103 A * | 9/1994 | LeMieux | 219/400 |
| 5,405,074 A * | 4/1995 | Den Dopper et al. | 228/42 |
| 5,440,101 A | 8/1995 | Cox et al. | |

(Continued)

FOREIGN PATENT DOCUMENTS

EP    1732118 A1    12/2006

(Continued)

OTHER PUBLICATIONS

International Search Report for PCT/US2011/041946 mailed Oct. 12, 2011.

Primary Examiner — Kiley Stoner
Assistant Examiner — Carlos Gamino
(74) Attorney, Agent, or Firm — Lando & Anastasi, LLP (57) ABSTRACT

A reflow oven chamber assembly that is configured to be installed within a reflow oven chamber of a reflow oven includes a chamber housing disposed within the reflow oven chamber, one or more heating elements disposed in the chamber housing, and one or more compression box assemblies disposed in the chamber housing. The compression box assembly includes a compression box housing having an intake port located adjacent the heating element, an intake duct disposed in the compression box, and a diffuser plate disposed above the intake duct. The intake duct has an inlet opening in fluid communication with the intake port of the compression box housing and an outlet opening. The compression box assembly is configured to draw heated air into the compression box housing from the reflow oven chamber through the intake port and into the inlet opening of the intake duct and exhaust air out of the outlet opening of the intake duct to the diffuser plate. A method of distributing heated air within a reflow soldering oven is further disclosed.

16 Claims, 5 Drawing Sheets

U.S. PATENT DOCUMENTS

| | | | |
|---|---|---|---|
| 5,971,246 A | 10/1999 | Aun et al. | |
| 6,123,250 A | 9/2000 | De Klein et al. | |
| RE36,960 E * | 11/2000 | Boswell et al. | 228/43 |
| 6,145,734 A | 11/2000 | Taniguchi et al. | |
| 6,345,757 B1 * | 2/2002 | Sakuyama et al. | 228/102 |
| 6,354,481 B1 | 3/2002 | Rich et al. | |
| 6,386,422 B1 | 5/2002 | Cheng et al. | |
| 6,394,794 B2 * | 5/2002 | Bloom et al. | 432/128 |
| 6,402,011 B1 | 6/2002 | Taniguchi et al. | |
| 6,437,289 B1 | 8/2002 | Yokota | |
| 6,446,855 B1 | 9/2002 | Rich | |
| 6,749,655 B2 | 6/2004 | Dautenhahn | |
| 6,761,301 B2 * | 7/2004 | Mukuno et al. | 228/42 |
| 7,690,550 B2 * | 4/2010 | Yokota | 228/43 |
| 7,708,183 B2 | 5/2010 | Dautenhahn | |
| 7,735,708 B2 * | 6/2010 | Yamada | 228/42 |
| 7,951,244 B2 | 5/2011 | Becker et al. | |
| 7,988,031 B2 * | 8/2011 | Nakamura et al. | 228/42 |
| 2003/0218058 A1 | 11/2003 | Shaw et al. | |
| 2007/0045382 A1 * | 3/2007 | Shibamura et al. | 228/42 |

FOREIGN PATENT DOCUMENTS

| | | | |
|---|---|---|---|
| JP | 2002198642 A * | 7/2002 | |
| JP | 2005079466 A * | 3/2005 | |

* cited by examiner

COMPRESSION BOX FOR REFLOW OVEN HEATING WITH A PRESSURIZING PLATE

CROSS-REFERENCE TO RELATED APPLICATIONS

This application claims priority under 35 U.S.C. §119(e) to U.S. Provisional Application No. 61/359,222, entitled "COMPRESSION BOX FOR REFLOW OVEN HEATING," filed Jun. 28, 2010, which is hereby incorporated by reference in its entirety for all purposes.

BACKGROUND OF THE INVENTION

1. Field of the Disclosure

This application relates generally to the surface mount of electronic components onto a printed circuit board by employing a reflow process, and more particularly to a compression box of a reflow soldering oven that is designed to provide uniform airflow of heated air to the printed circuit board during the reflow process.

2. Discussion of Related Art

In the fabrication of printed circuit boards, electronic components are often surface mounted to a bare board by a process known as "reflow soldering." In a typical reflow soldering process, a pattern of solder paste is deposited onto the circuit board, and the leads of one or more electronic component are inserted into the deposited solder paste. The circuit board is then passed through an oven where the solder paste is reflowed (i.e., heated to a melt or reflow temperature) in the heated zones and then cooled in a cooling zone to electrically and mechanically connect the leads of the electronic component to the circuit board. The term "circuit board" or "printed circuit board," as used herein, includes any type of substrate assembly of electronic components, including, for example, wafer substrates.

For each heating zone, reflow ovens incorporate a series of compression boxes, which serve the purpose of distributing heated convection air to a printed circuit board during the reflow soldering process. The reflow soldering process has recently advanced by transitioning from traditional tin-lead solder to lead-free materials. These new soldering materials have reduced the process windows and require that the temperature variances across a printed circuit board be reduced. The importance of reduced temperature variance, known in the industry as "ΔT," has driven the need to optimize the design of the compression box for uniform airflow to achieve uniform heating of the printed circuit board across its entire width.

Large temperature variances across a printed circuit board can result in insufficient heating of solder joints or overheating of printed circuit board components. These defects can result in rework and/or scrap of the printed circuit board, which can be extremely costly to the printed circuit board manufacturer.

BRIEF SUMMARY OF THE INVENTION

One aspect of the disclosure is directed to a reflow oven chamber assembly configured to be installed within a reflow oven chamber of a reflow oven of the type used to join electronic components to a substrate. In one embodiment, the reflow oven chamber assembly comprises a chamber housing disposed within the reflow oven chamber, at least one heating element disposed in the chamber housing, and at least one compression box assembly disposed in the chamber housing. In a certain embodiment, the at least one compression box assembly includes a compression box housing having at least one intake port located adjacent the at least one heating element, an intake duct disposed in the compression box, and a diffuser plate disposed above the intake duct. The intake duct has at least one inlet opening in fluid communication with the at least one intake port of the compression box housing and an outlet opening. The compression box assembly is configured to draw heated air into the compression box housing from the reflow oven chamber through the at least one intake port and into the at least one inlet opening of the intake duct and exhaust air out of the outlet opening of the intake duct to the diffuser plate.

Embodiments of the reflow oven chamber assembly may include a pressure distribution device positioned between the intake duct and the compression box housing at a location of the outlet opening. The pressure distribution device includes at least one vane to enable fluid communication from outlet opening of the intake duct to the diffuser plate. The compression box assembly further includes an air blower device positioned within the pressure distribution device, the air blower device being configured to direct heated air from the intake duct to the diffuser plate. The compression box assembly further includes a pressure equalizing plate positioned between the intake duct and the diffuser plate. The pressure equalizing plate extends from one end of the intake duct to an opposite end of the intake duct. The diffuser plate includes a plurality of openings formed therein. The compression box housing includes four intake ports, and wherein the intake duct includes four inlet openings aligned to and in fluid communication with the four intake ports of the compression box housing. The compression box housing has four sides, each side having an intake port. Similarly, the intake duct includes four sides, each side having an inlet opening. The reflow further includes at least two compression box assemblies and a zone divider plate disposed between the at least two compression box assemblies. The reflow oven further includes at least two heating elements disposed at opposite ends of the compression box.

Another aspect of the disclosure is directed to a method of distributing heated air within a reflow soldering oven of the type comprising a reflow oven chamber assembly configured to be installed within a reflow oven chamber, the reflow oven chamber assembly including a chamber housing disposed within the reflow oven chamber, at least one heating element disposed in the chamber housing, and at least one compression box assembly disposed in the chamber housing, the at least one compression box assembly including a compression box housing having at least one intake port positioned adjacent the at least one heating element, an intake duct disposed in the compression box, the intake duct having at least one inlet opening in fluid communication with the at least one intake port of the compression box housing and an outlet opening, and a diffuser plate disposed above the intake duct. In one embodiment, the method comprises: drawing heated air into the compression box housing from the reflow oven chamber through the at least one intake port and into the at least one inlet opening of the intake duct; and exhausting air out of the outlet opening of the intake duct to the diffuser plate.

Embodiments of the method further comprise positioning a pressure distribution device between the intake duct and the compression box housing at a location of the outlet opening, and/or positioning an air blower device in the pressure distribution device, the air blower device being configured to direct heated air from the compression box to the diffuser plate, and/or positioning a pressure equalizing plate between the intake duct and the diffuser plate.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE INVENTION

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Solder paste is routinely used in the assembly of printed circuit boards, where the solder paste is used to join electronic components to the circuit board. Solder paste includes solder for joint formation and flux for preparing metal surfaces for solder attachment. The solder paste may be deposited onto the metal surfaces (e.g., electronic pads) provided on the circuit board by using any number of application methods. In one example, a stencil printer may employ a squeegee to force the solder paste through a metallic stencil laid over an exposed circuit board surface. In another example, a dispenser may dispense solder paste material onto specific areas of the circuit board. Leads of an electronic component are aligned with and impressed into the solder deposits to form the assembly. In reflow soldering processes, the solder is then heated to a temperature sufficient to melt the solder and cooled to permanently couple the electronic component, both electrically and mechanically, to the circuit board. The solder typically includes an alloy having a melting temperature lower than that of the metal surfaces to be joined. The temperature also must be sufficiently low so as to not cause damage to the electronic component. In certain embodiments, the solder may be a tin-lead alloy. However, solders employing lead-free materials may also be used.

In the solder, the flux typically includes a vehicle, solvent, activators and other additives. The vehicle is a solid or nonvolatile liquid that coats the surface to be soldered and can include rosin, resins, glycols, polyglycols, polyglycol surfactants, and glycerine. The solvent, which evaporates during the pre-heat and soldering process, serves to dissolve the vehicle activators, and other additives. Examples of typical solvents include alcohols, glycols, glycol esters and/or glycol ethers and water. The activator enhances the removal of metal oxide from the surfaces to be soldered. Common activators include amine hydrochorides, dicarboxylic acids, such as adipic or succinic acid, and organic acids, such as citric, malic or abietic acid. Other flux additives can include surfactants, viscosity modifiers and additives for providing low slump or good tack characteristics for holding the components in place before reflow.

Figure 1:
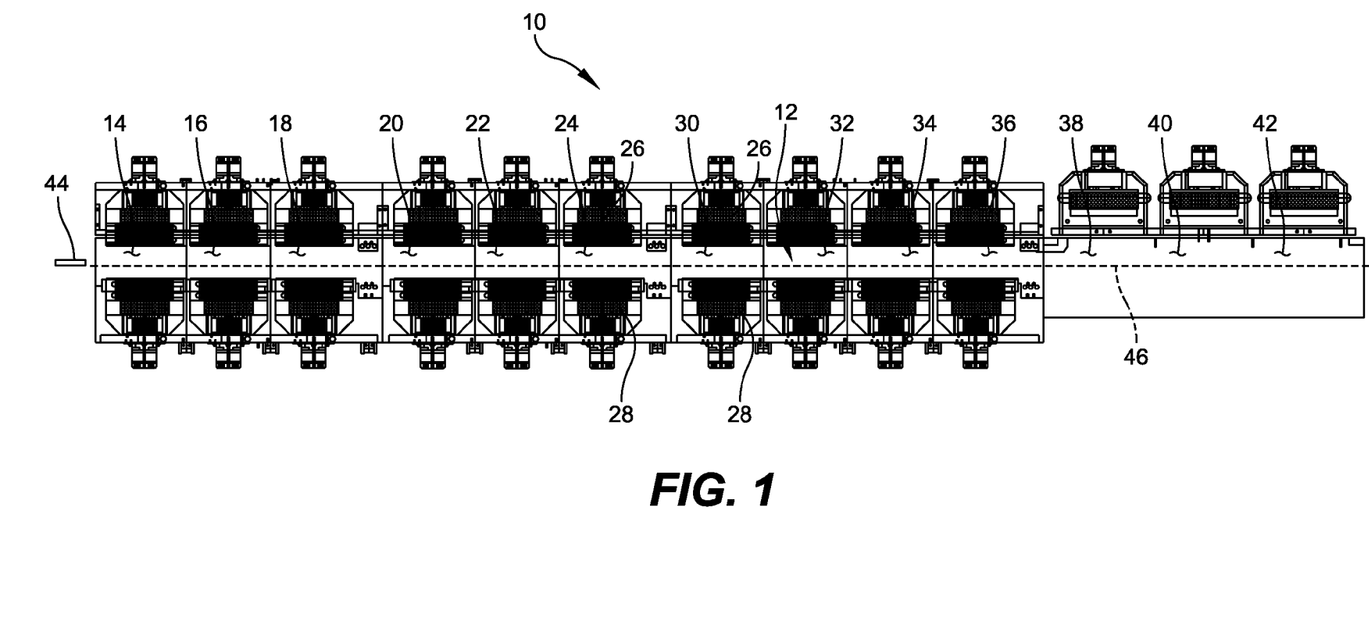
FIG. 1 is a schematic view of a reflow soldering oven of an embodiment of the disclosure.

One embodiment of a reflow soldering apparatus for soldering the circuit board assembly is shown in FIG. 1. Such apparatus are sometimes referred to as reflow ovens or reflow soldering ovens in the art of printed circuit board fabrication and assembly. The reflow soldering oven, generally indicated at 10 in FIG. 1, includes a reflow oven chamber 12 in the form of a thermally insulated tunnel defining a passage for pre-heating, reflowing and then cooling solder on a circuit board passing therethrough. The reflow oven chamber 12 extends across a plurality of heating zones, including, in one example, three pre-heat zones 14, 16, 18 followed by three soak zones 20, 22, 24, each zone comprising top and bottom heaters 26, 28, respectively. The soak zones 20, 22, 24 are followed by four spike zones 30, 32, 34, 36, for example, which likewise include heaters 26, 28. And finally, three cooling zones 38, 40, 42 follow the spike zones 30, 32, 34, 36.

A circuit board assembly 44, including deposited solder paste and electronic components, is passed (e.g., left-to-right in FIG. 1) through each zone of the thermally insulated reflow oven chamber 12 on a fixed-speed conveyor, indicated by dashed lines at 46 in FIG. 1, thereby enabling controlled and gradual pre-heat, reflow and post-reflow cooling of the circuit board assembly. In the preliminary pre-heat zones 14, 16, 18, the board is heated from ambient temperature up to the flux activation temperature, which may range between about 130° C. and about 150° C. for lead-based solders and higher for lead-free solders.

In the soak zones 20, 22, 24, variations in temperature across the circuit board assembly are stabilized and time is provided for the activated flux to clean the component leads, electronic pads and solder powder before reflow. Additionally, VOCs in the flux are vaporized. The temperature in the soak zones 20, 22, 24 is typically about 140° C. to about 160° C. for lead-based solders and higher for lead-free solders. In certain embodiments, the circuit board assembly may spend about thirty to about forty-five seconds passing through the soak zones 20, 22, 24.

In the spike zones 30, 32, 34, 36, the temperature quickly increases to a temperature above the melting point of the solder to reflow the solder. The melting point for eutectic or near-eutectic tin-lead solder is about 183° C., with the reflow spike being typically set about 25° C. to about 50° C. above the melting point to overcome a pasty range of molten solder. For lead-based solders, a typical maximum temperature in the spike zones is in the range of about 200° C. to about 220° C. Temperatures above about 225° C. may cause baking of the flux, damage to the components and/or sacrifice joint integrity. Temperatures below about 200° C. may prevent the joints from fully reflowing. In one embodiment, the circuit board assembly is typically maintained at a temperature within the spike zones 30, 32, 34, 36 above the reflow temperature for about one minute.

Next, in the cooling zones 38, 40, 42, the temperature drops below the reflow temperature, and the circuit board assembly is cooled sufficiently to solidify the joints and thereby preserve joint integrity before the circuit board assembly leaves the reflow oven chamber 12.

A flux extraction/filtration system (not shown) may be provided to remove contaminant materials from the gas generated by the reflow soldering oven 10. In one embodiment, an input gas duct (not shown) may be connected to or between selected zones to provide fluid communication from the reflow oven chamber 12 to the flux extraction/filtration system. An output gas duct (also not shown) may be connected to or between the selected zones to provide fluid communication from the flux extraction/filtration system back to the reflow oven chamber 12. In operation, a vapor stream is withdrawn from the reflow oven chamber 12 through the input gas duct, through the system, then through the output gas duct and back to the reflow oven chamber. Similar constructions of input gas ducts, systems and output gas ducts may be likewise positioned to withdraw vapor streams from or between other zones of the reflow soldering oven 10.

Figure 2:
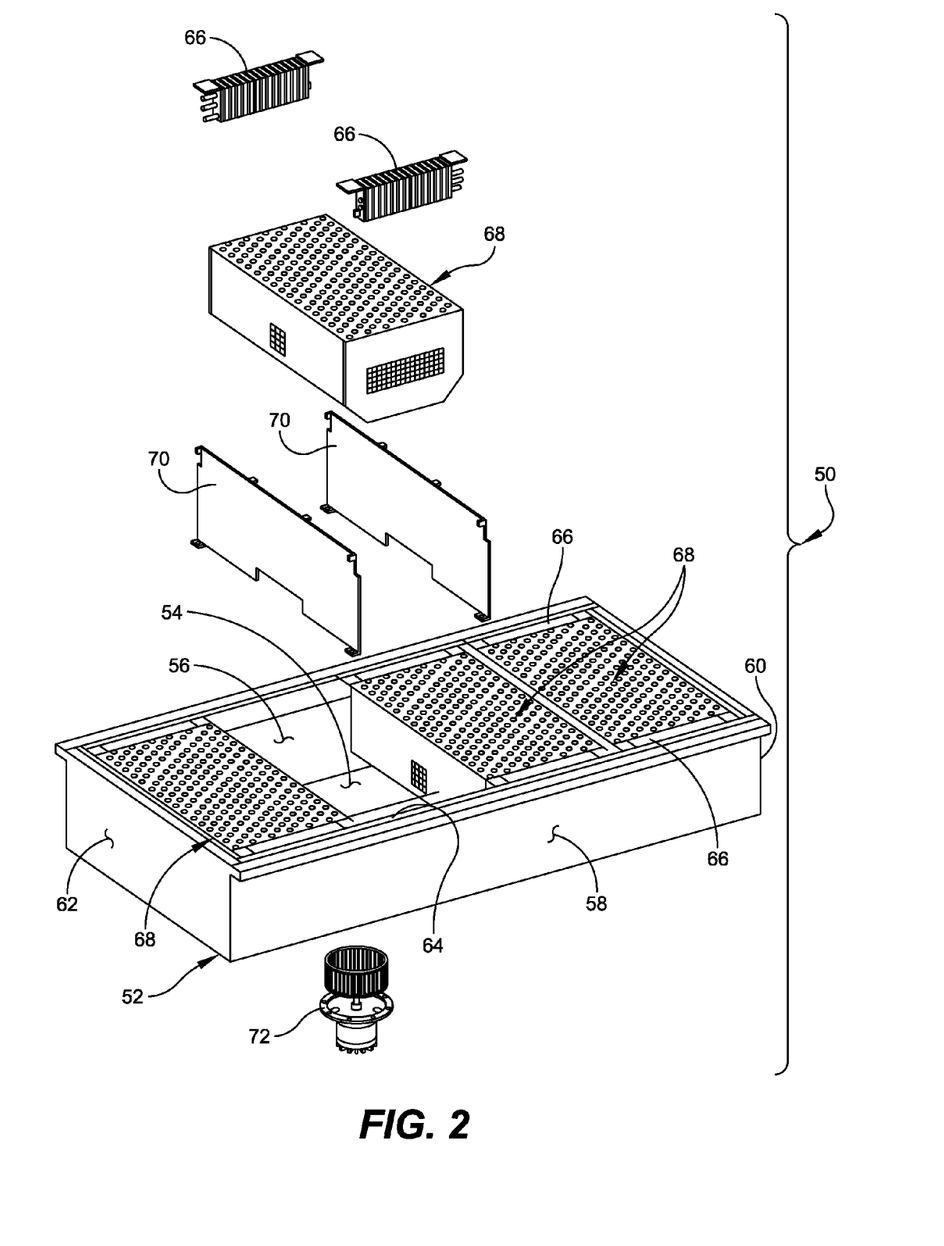
FIG. 2 is an exploded perspective view of a reflow oven chamber assembly of the reflow soldering oven.

Turning now to FIG. 2, the several zones (e.g., pre-heat zones 14, 16, 18, soak zones 20, 22, 24, and/or spike zones 30, 32, 34, 36) including heaters 26, 28 of the reflow oven include a reflow oven chamber assembly, which is generally indicated at 50. In the shown embodiment, the reflow oven chamber assembly 50 embodies four such zones. It should be noted that the reflow oven chamber assembly 50 may be configured to have any suitable number of zones needed or required within the reflow soldering oven. Also, it should be noted that FIG. 2 illustrates the lower reflow oven chamber assembly 50. A similar upper reflow oven chamber assembly may be provided in addition to or in lieu of the lower reflow oven chamber assembly to deliver heated air from above the printed circuit board as the board travels through the reflow oven.

The reflow oven chamber assembly 50 includes a rectangular-shaped chamber housing generally indicated at 52 having a bottom 54, two relatively longer sides 56, 58, two relatively shorter ends 60, 62, and an open top 64. The chamber housing 52 is configured to enclose and mount the components of the reflow oven chamber assembly 50, and is further configured to be suitably secured within the reflow oven chamber 12 of the reflow soldering oven 10. The reflow chamber assembly 50 further includes eight heating elements, each indicated at 66, which are disposed along the long sides 56, 58 of the chamber housing 52. The heating elements 66 provide the heat required for the particular zone, such as the soak zones 20, 22, 24 or the spike zones 30, 32, 34, 36. The heating elements 66 are designed to provide convection heating.

The reflow chamber assembly 50 also includes four compression box assemblies, each indicated 68, which are received in the chamber housing 52. The compression box assemblies 68 are configured to distribute uniform airflow of heated air to printed circuit boards (e.g., circuit board 44) during reflow process. The compression box assemblies 68 are oriented within the chamber housing 52 such that long sides of the compression box assemblies extend in a direction that is perpendicular to the direction of the long sides 56, 58 of the chamber housing. Zone dividers, each indicated at 70, are positioned between adjacent compression box assemblies 68 to separate the individual zones. The zone dividers 70 are provided to segregate zones within the reflow oven 10. In addition, an air blower device 72 is provided for each compression box assembly 68 to direct the flow of heated air from the compression box assembly to the reflow oven chamber assembly 50. As shown in FIG. 2, there are two heating elements 66 for each compression box assembly 68. The arrangement is such that the heating elements 66 are positioned at the ends of the compression box assembly 68, the construction of which will be described in detail as the description of the disclosure proceeds.

Figure 3:
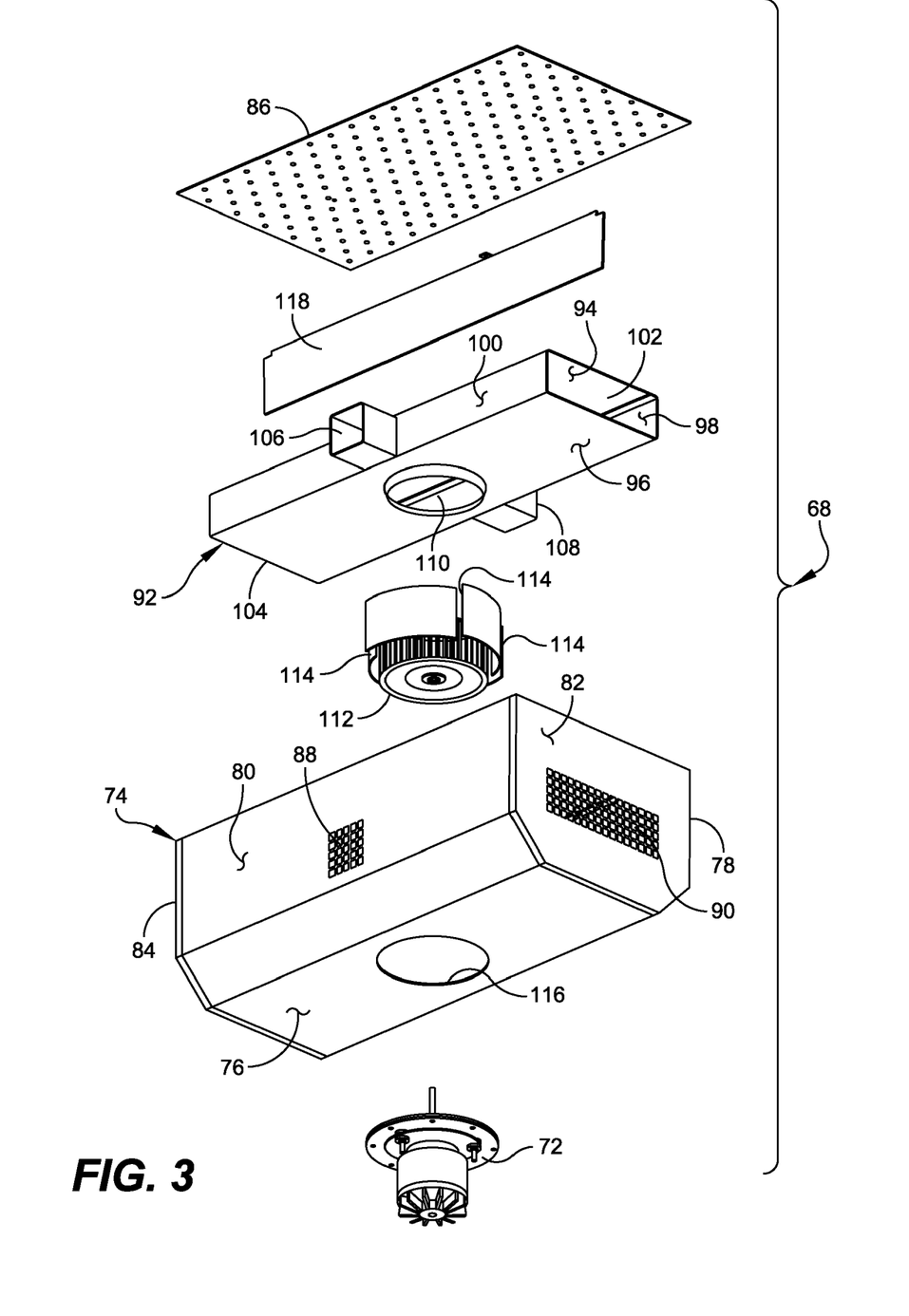
FIG. 3 is an exploded perspective view of a compression box assembly of the reflow oven chamber assembly.

Referring to FIG. 3, each compression box assembly includes a compression box housing, generally indicated at 74, having a bottom wall 76, two side walls 78, 80, two end walls 82, 84 and a perforated top wall or diffuser plate 86. The two side walls 78, 80 have relatively smaller intake ports 88 that are formed by creating a series of small openings in a square pattern. Similarly, the two end walls 82, 84 have relatively larger intake ports 90 that are also formed by creating a series of small openings in a rectangular pattern. In one embodiment, the intake ports 88, 90 are fabricated by stamping the sheet metal of the compression box housing 74 with $\frac{3}{8}$-inch perforated square openings. This pattern of openings provides an optimum combination of intake versus discharge pressures for stable blower operation during operation.

Each compression box assembly 68 further includes a four-way intake duct generally indicated at 92. The intake duct 92 includes a rectangular body having a top 94, a bottom 96, two long sides 98, 100 and two open ends 102, 104. Provided along each side 98, 100 are inlet openings 106, 108, respectively, which are centrally located along their respective sides and shaped to correspond to the shape and size of the intake ports 88 along the sides 78, 80 of the compression box housing 74. Similarly, the open ends 102, 104 of the intake duct 92 are each shaped to correspond to the shape and size of the intake port 90 provided at the end 82, 84 of the compression box housing 74. The four inlet openings 102, 104, 106, 108 enable air to be drawn in from completely around the perimeter of the compression box assembly 68. This construction provides an efficient return of the discharged air back to the compression box assembly 68, thus achieving a closed-loop system when used. The areas of the inlet openings, 106, 108 and their respective intake openings 88 are approximately one-half the size of the areas of the inlet openings 102, 104 and their respective intake openings 90. This construction is designed to force the majority of the air to be drawn on the end walls 82, 84 of the compression box housing 74 through the heating elements 66. The bottom 96 of the intake duct 92 further includes an outlet opening 110 through which air drawn into the intake duct flows when exhausted from the intake duct.

In one embodiment, the compression box assembly 68 further includes a pressure distribution device 112 that is positioned between the intake duct 92 and the bottom wall 76 of the compression box housing 74 at a location of the outlet opening 110 of the intake duct. As shown, the pressure distribution device 112 includes four vanes each indicated at 114 that are designed to "peel-off" and equally distribute the air pressure from the air blower device 72 to all parts of the compression box assembly 68. As shown, the air blower device 72 is secured to an outer surface of the bottom wall 76 (e.g., by suitable fasteners) of the compression box housing 74 so that the air blower device 72 extends through an opening 116, which is coaxial with the outlet opening 110 of the intake duct 92. The arrangement is such that the air blower device 72 is positioned within the pressure distribution device 112 to drive the movement of air from the intake duct 92 through the outlet opening 110 and around the outer surfaces of the intake duct to the diffuser plate 86.

In one embodiment, the compression box assembly 68 further includes a pressure equalizing plate 118 that is positioned between the intake duct 92 and the diffuser plate 86. As shown, the pressure equalizing plate 118 extends from one end (e.g., end 102) of the intake duct 92 to an opposite end (e.g., end 104) of the intake duct. The pressure equalizing plate 118 bisects the compression box housing 74 from end-to-end and extends from the bottom of the diffuser plate 86 to the top 94 of the intake duct 92. The provision of the pressure equalizing plate 118 is designed to segregate the compression box assembly 68, which results in equal pressure distribution under the diffuser plate 86.

As mentioned above, the compression box housing 74 includes a perforated top wall or diffuser plate 86 to distribute air from the compression box assembly 68 to the reflow oven chamber. In a certain embodiment, the diffuser plate 86 consists of 192 holes in a staggered pattern to provide consistent, uniform airflow to the printed circuit board. These holes are stamped from sheet metal material such that they form a converging nozzle that results in a uniform airstream.

Figure 4:
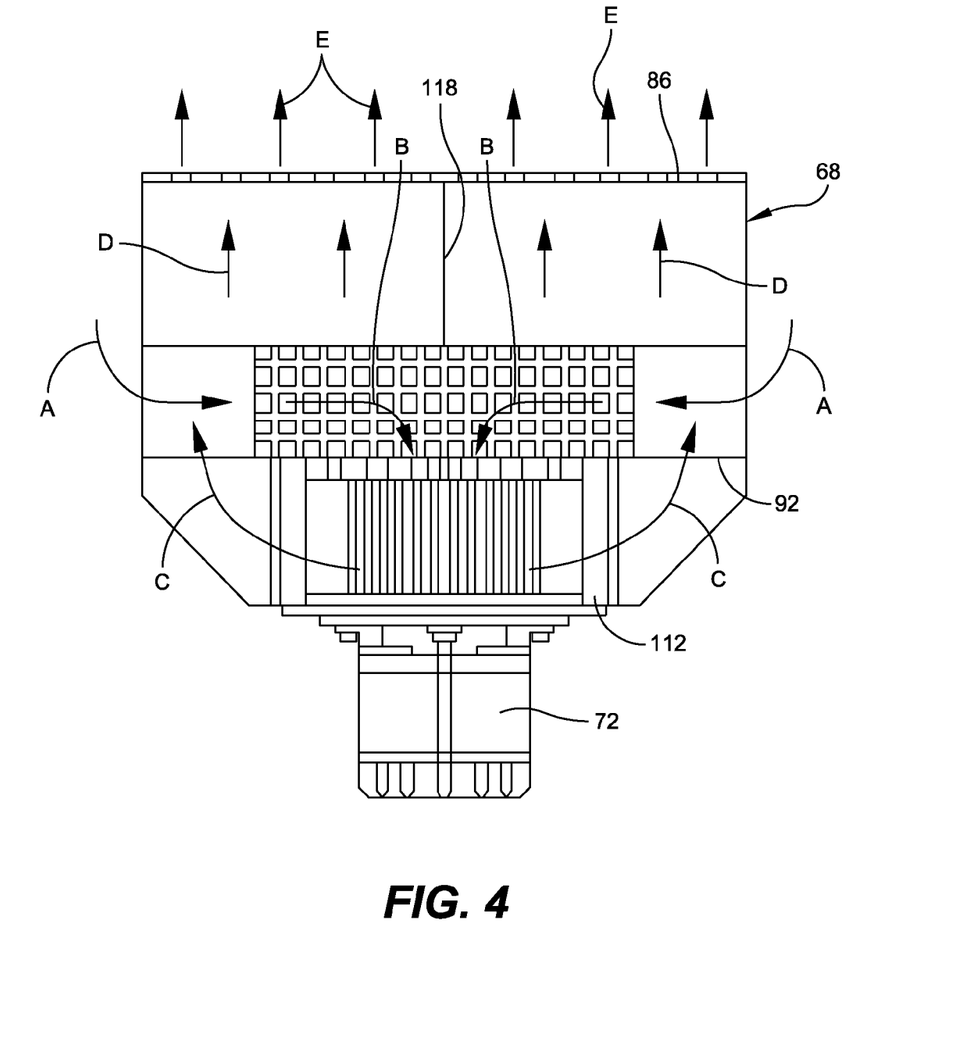
FIG. 4 is a front elevational view of airflow generated by the compression box assembly.
Figure 5:
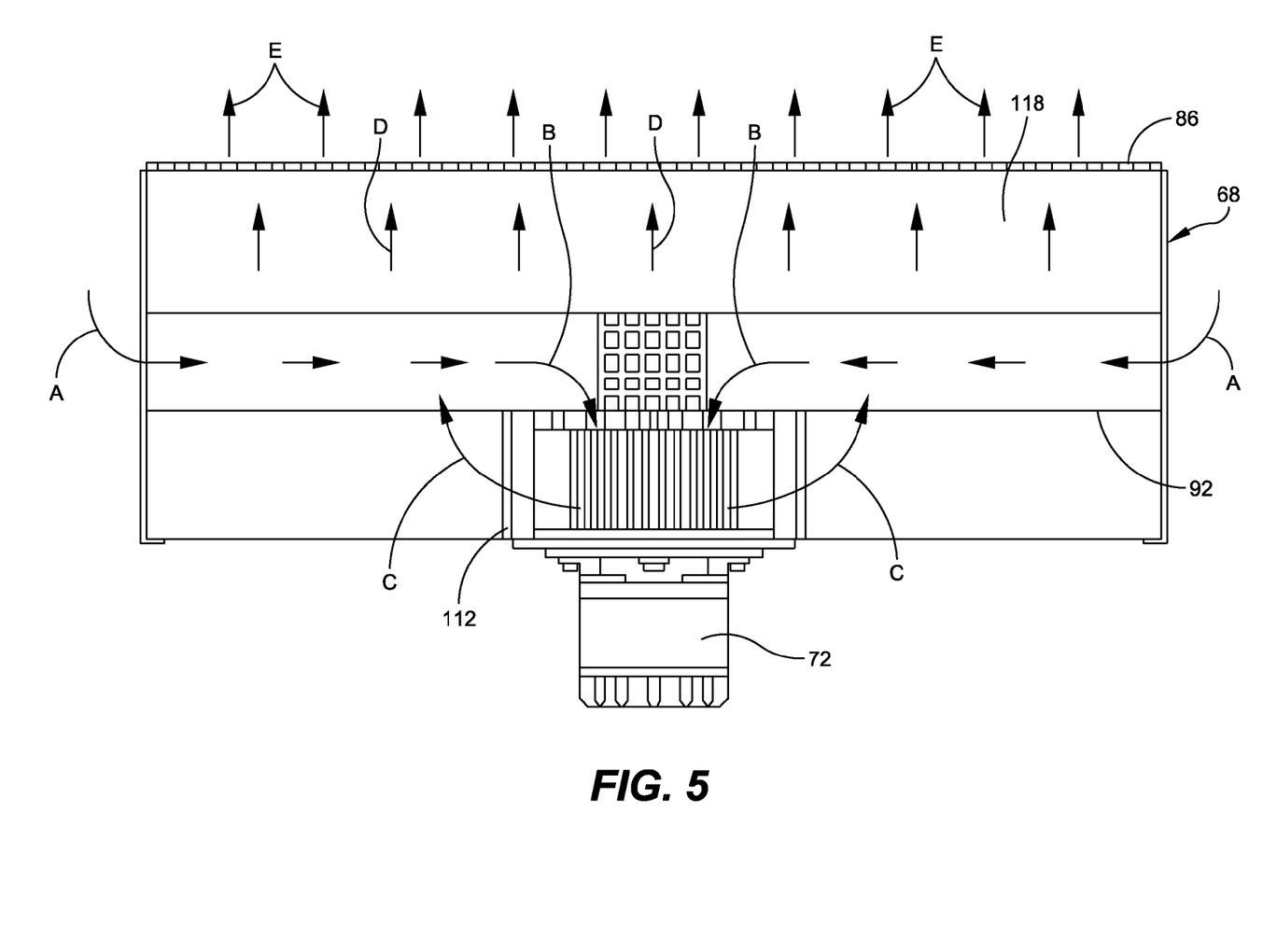
FIG. 5 is a side elevational view thereof.

FIGS. 4 and 5 illustrate the airflow through the compression box assembly 68 as generated by the air blower device 72 with air entering the intake duct 92 and exiting the diffuser plate 86. Specifically, air enters the intake duct 92 as illustrated by arrows A. The air entering the intake duct transitions into the air blower device 72 via outlet opening (not designated) as illustrated by arrows B. The air blower device 72 moves air through the pressure distribution device 112 where air exits the vanes (not designated) as illustrated by arrows C. The air travels into the space between the top of the intake duct 92 and the diffuser plate 86 as defined by the pressure equalizing plate 118 as illustrated by arrows D. Air then exits the compression box assembly 68 into the chamber through the diffuser plate 86 as illustrated by arrows E.

Embodiments of the present disclosure further include one or more methods of distributing heated air within a reflow soldering oven of the type described above with reference to reflow soldering oven 10. In one embodiment, the method comprises: drawing heated air into the compression box assembly 68 from the reflow oven chamber through the intake ports 88, 90 into the inlet openings 102, 104, 106, 108 and exhausting air out of the outlet opening 110 to the diffuser plate 86. In another embodiment, a pressure distribution device 112 is positioned between the intake duct 92 and the compression box housing 74 at a location of the outlet opening 110. In a further embodiment, an air blower device 72 is positioned adjacent the pressure distribution device 112. The air blower device 72 is configured to direct heated air from the compression box housing 74 to the diffuser plate 86. In yet another embodiment, a pressure equalizing plate 118 is positioned between the intake duct 92 and the diffuser plate 86.

Thus, it should be observed that the reflow oven chamber assembly 50 of the present disclosure improves the airflow of heated air within the reflow oven 10.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

For example, variations of the reflow oven chamber assembly 50 may include varying the number of holes, the pattern of holes, the hole size, and the hole shape in the diffuser plate 86. The placement of the heating elements 66 in relation to the compression box may be varied as well. In addition, the number of holes, hole pattern, hole size and hole shape of the intake ports 88, 90 formed in the compression box housing 74 may be varied. Further, the number, size and orientation of the outlet vanes 114 of the pressure distribution device 112 may be varied.

What is claimed is:

1. A reflow oven chamber assembly of a reflow oven of the type used to join electronic components to a substrate, the reflow oven chamber assembly comprising:
a chamber housing;
at least one heating element disposed in the chamber housing; and
at least one compression box assembly disposed in the chamber housing, the at least one compression box assembly including
a compression box housing having four sides, each having an intake port formed therein,
an intake duct disposed in the compression box, the intake duct having four sides, each having an inlet opening formed therein, the inlet openings being aligned to and in fluid communication with the port respective intake ports of the compression box housing and an outlet opening,
a diffuser plate disposed entirely above the intake duct, and
a pressure equalizing plate positioned between the intake duct and the diffuser plate, the pressure equalizing plate extending from one end of the intake duct to an opposite end of the intake duct to bisect the compression box housing,
wherein the compression box assembly is configured to draw heated air into the compression box housing through the intake ports and into the inlet openings of the intake duct and exhaust air out of the outlet opening of the intake duct to the diffuser plate.

2. The reflow oven chamber assembly of claim 1, wherein the compression box assembly further includes a pressure distribution device positioned between the intake duct and the compression box housing at a location of the outlet opening.

3. The reflow oven chamber assembly of claim 2, wherein the pressure distribution device includes at least one vane to enable fluid communication from outlet opening of the intake duct to the diffuser plate.

4. The reflow oven chamber assembly of claim 2, wherein the compression box assembly further includes an air blower device positioned within the pressure distribution device, the air blower device being configured to direct heated air from the intake duct to the diffuser plate.

5. The reflow oven chamber assembly of claim 1, wherein the diffuser plate includes a plurality of openings formed therein.

6. The reflow oven chamber assembly of claim 1, further comprising at least two compression box assemblies and a zone divider plate disposed between the at least two compression box assemblies.

7. The reflow oven chamber assembly of claim 1, further comprising at least two heating elements disposed at opposite ends of the compression box.

8. A reflow oven chamber assembly of a reflow oven of the type used to join electronic components to a substrate, the reflow oven chamber assembly comprising:
a chamber housing;
at least one heating element disposed in the chamber housing; and
at least one compression box assembly disposed in the chamber housing, the at least one compression box assembly including
a compression box housing having at least one intake port located adjacent the at least one heating element,
an intake duct disposed in the compression box, the intake duct having at least one inlet opening in fluid communication with the at least one intake port of the compression box housing and an outlet opening,
a diffuser plate disposed entirely above the intake duct, and
a pressure equalizing plate positioned between the intake duct and the diffuser plate, the pressure equalizing plate extending from one end of the intake duct to an opposite end of the intake duct to bisect the compression box housing, wherein the compression box assembly is configured to draw heated air into the compression box housing through the at least one intake port and into the at least one inlet opening of the intake duct and exhaust air out of the outlet opening of the intake duct to the diffuser plate.

9. The reflow oven chamber assembly of claim 8, wherein the compression box assembly further includes a pressure distribution device positioned between the intake duct and the compression box housing at a location of the outlet opening.

10. The reflow oven chamber assembly of claim 9, wherein the pressure distribution device includes at least one vane to enable fluid communication from outlet opening of the intake duct to the diffuser plate.

11. The reflow oven chamber assembly of claim 9, wherein the compression box assembly further includes an air blower device positioned within the pressure distribution device, the air blower device being configured to direct heated air from the intake duct to the diffuser plate.

12. The reflow oven chamber assembly of claim 8, wherein the diffuser plate includes a plurality of openings formed therein.

13. The reflow oven chamber assembly of claim 8, wherein the compression box housing includes four intake ports, and wherein the intake duct includes four inlet openings aligned to and in fluid communication with the four intake ports of the compression box housing.

14. The reflow oven chamber assembly of claim 13, wherein the compression box housing has four sides, each side having on of the four intake ports, and wherein the intake duct includes four sides and four inlet openings, each side having one of the four inlet openings.

15. The reflow oven chamber assembly of claim 8, further comprising at least two compression box assemblies and a zone divider plate disposed between the at least two compression box assemblies.

16. The reflow oven chamber assembly of claim 8, further comprising at least two heating elements disposed at opposite ends of the compression box.

* * * * *